United States Patent
Chang et al.

(10) Patent No.: US 12,347,678 B2
(45) Date of Patent: Jul. 1, 2025

(54) MOCVD METHOD FOR GROWING INALGAN/GAN HETEROSTRUCTURE

(71) Applicant: National Yang Ming Chiao Tung University, Hsinchu (TW)

(72) Inventors: Edward Yi Chang, Baoshan Township (TW); You-Chen Weng, New Taipei (TW); Xia-Xi Zheng, Hsinchu (TW)

(73) Assignee: NATIONAL YANG MING CHIAO TUNG UNIVERSITY, Hsinchu (TW)

( * ) Notice: Subject to any disclaimer, the term of this patent is extended or adjusted under 35 U.S.C. 154(b) by 436 days.

(21) Appl. No.: 18/094,836

(22) Filed: Jan. 9, 2023

(65) Prior Publication Data

US 2024/0213020 A1    Jun. 27, 2024

(30) Foreign Application Priority Data

Dec. 26, 2022 (TW) ................... 111150012

(51) Int. Cl.
*H01L 21/02* (2006.01)
*H01L 21/56* (2006.01)

(52) U.S. Cl.
CPC ...... *H01L 21/0254* (2013.01); *H01L 21/0217* (2013.01); *H01L 21/02211* (2013.01);
(Continued)

(58) Field of Classification Search
CPC .............. H01L 21/0254; H01L 21/0217; H01L 21/02211; H01L 21/02271; H01L 21/02304; H01L 21/0262; H01L 21/56; H01L 21/02458; H01L 21/02505; H01L 21/02664; H10D 30/015; H10D 30/475; H10D 62/8503
See application file for complete search history.

(56) References Cited

U.S. PATENT DOCUMENTS

| | | | |
|---|---|---|---|
| 9,853,138 B2 | 12/2017 | Yamada | |
| 12,191,626 B1 * | 1/2025 | McLaurin | .............. H10D 8/043 |
| 2021/0111192 A1 | 4/2021 | Lee et al. | |

FOREIGN PATENT DOCUMENTS

| | | | | |
|---|---|---|---|---|
| TW | 201919238 A | | 5/2019 | |
| WO | WO2018/196948 | * | 11/2018 | ...................... 29/778 |
| WO | WO2022/032588 A1 | | 2/2022 | |

OTHER PUBLICATIONS

Jiang et al., "Investigation of In Situ SiN as Gate Dielectric and Surface Passivation for GaN MISHEMTs", IEEE Transactions on Electron Devices, vol. 64, No. 3, pp. 832-839, Mar. 2017.

(Continued)

*Primary Examiner* — Victor A Mandala
(74) *Attorney, Agent, or Firm* — Birch, Stewart, Kolasch & Birch, LLP (57) ABSTRACT

A MOCVD method for growing an InAlGaN/GaN heterostructure comprises steps: sequentially growing a nitride nucleation layer, a GaN buffer layer, an InAlGaN barrier layer on a substrate; using a precursor gas containing silane to in-situ grow a SiNx protective layer on the InAlGaN barrier layer at a temperature of 950-1000° C. in the same reaction chamber. Thereby is achieved a SiNx/InAlGaN/GaN heterostructure having an ultrathin barrier layer, which is suitable to fabricate HEMT elements. The present invention needn't take sample out of the reaction chamber and thus can prevent the heterostructure from oxidation and damage.

9 Claims, 11 Drawing Sheets

(52) U.S. Cl.
CPC .. *H01L 21/02271* (2013.01); *H01L 21/02304* (2013.01); *H01L 21/0262* (2013.01); *H01L 21/56* (2013.01)

(56) References Cited

OTHER PUBLICATIONS

Lu et al., "Low trap states in in situ $SiN_x$/AlN/GaN metal-insulator-semiconductor structures grown by metal-organic chemical vapor deposition", Applied Physics Letters, vol. 105, No. 10, p. 102911, total of 5 pages, Sep. 2014.

Xia-Xi Zheng, "Growth and Characterization of Al(Ga,In)N/GaN Heterostructures by MOCVD for High Electron Mobility Transistor Applications", total of 3 pages, Aug. 11, 2022. A Declaration (total of 3 pages) corresponding to this reference is also attached.

Zheng et al., "Optimization for the growth condition of in situ SiNx cap layer on ultrathin barrier InAlGaN/GaN heterostructures by metal-organic chemical vapor deposition", Applied Physics Express 15, 021001 (2022), total of 7 pages, published online Jan. 10, 2022. A Declaration (total of 3 pages) corresponding to this reference is also attached.

\* cited by examiner

MOCVD METHOD FOR GROWING INALGAN/GAN HETEROSTRUCTURE

This application claims priority of Application No. 111150012 filed in Taiwan on 26 Dec. 2022 under 35 U.S.C. § 119; the entire contents of all of which are hereby incorporated by reference.

BACKGROUND OF THE INVENTION

Field of the Invention

The present invention relates to a heterostructure in a semiconductor element, particularly to a MOCVD method for growing an InAlGaN/GaN heterostructure.

Description of the Prior Art

Because of featuring high band gap, high breakdown field, high electron mobility, and superior thermal conductivity, GaN has been a next generation candidate material for high-frequency, high-efficiency, and high-power density energy conversion. About the GaN-based transistors, many people have paid attention to the high electron mobility transistor (HEMT) because two-dimensional electron gas (2DEG) forms on the interface. In comparison with the conventional AlGaN ternary compound, the InAlGaN barrier layer of the HEMT of the InAlGaN/GaN quaternary compound has a smaller thickness (about 3-5 nm after growth) and a stronger spontaneous polarization effect. Thus, the InAlGaN barrier layer of the HEMT of the InAlGaN/GaN quaternary compound has a higher density of electron gas. The abovementioned superior characteristics may lower the on-resistance. Therefore, the InAlGaN/GaN quaternary compound is very suitable to be used in high-frequency and high-power elements.

Traditionally, the silicon nitride grown by the plasma-enhanced CVD (PECVD-SiNx) and the silicon nitride grown by the low-pressure CVD system (LPCVD-SiNx) are used as the surface protective layer and the gate dielectric layer. The quality of the interface between the SiNx layer and the InAlGaN barrier layer is very sensitive to the growth conditions and may influence the performance of elements. Therefore, the fabrication process should be optimized to grow a high-quality SiNx layer and decrease the defects generated by epitaxially growing the SiNx layer on the thin barrier layer.

SUMMARY OF THE INVENTION

The primary objective of the present invention is to provide a Metal-organic Chemical Vapor Deposition (MOCVD) method for growing an InAlGaN/GaN heterostructure, wherein the SiNx protective layer is grown in-situ after the barrier layer has been grown, whereby the sample needn't be taken out of the reaction chamber during the epitaxial process, wherefore the surface of the heterostructure is exempted from oxidation and damage.

Another objective of the present invention is to provide a MOCVD method for growing an InAlGaN/GaN heterostructure, wherein the fabrication process is optimized to grow a high-quality SiNx protective layer and decrease the defects of the epitaxial interface.

In order to achieve the abovementioned objectives, the present invention proposes a method for growing an InAlGaN/GaN heterostructure, which is realized by a MOCVD system and comprises Step (1): providing a substrate, and sequentially growing a nitride nucleation layer, a GaN buffer layer, an InAlGaN barrier layer on the substrate; and Step (2): using a precursor gas containing silane to in-situ grow a SiNx protective layer on the InAlGaN barrier layer at a temperature of 950-1000° C., Wherein Step (1) and Step (2) are undertaken in the same reaction chamber.

In one embodiment, the precursor gas contains silane ($SiH_4$), disilane ($Si_2H_6$), trisilane ($Si_3H_8$), tetrasilane ($Si_4H_{10}$), tetraethoxysilane (TEOS), or a combination thereof.

In one embodiment, Step (2) is performed for 2-5 seconds at a gas flow rate of 5-8 sccm and a chamber pressure of less than 50 Torr.

In one embodiment, the nitride nucleation layer is an aluminum nitride (AlN) layer.

In one embodiment, Step (1) further includes providing a transitional layer, wherein the transitional layer is grown between the nitride nucleation layer and the GaN buffer layer.

In one embodiment, Step (1) further include providing a barrier intermediate layer, wherein the barrier intermediate layer is grown between the GaN buffer layer and the InAlGaN barrier layer; the barrier intermediate layer may be an aluminum nitride (AlN) layer.

In one embodiment, Step (1) uses trimethyl indium (TMIn), trimethyl aluminum (TMAl), trimethyl gallium (TMGa), and ammonia gas ($NH_3$) as the precursor materials to grow the InAlGaN barrier layer.

In one embodiment, the InAlGaN barrier layer has a thickness of 3-5 nm.

In comparison with the conventional technologies, the present invention has the following advantages and technical effects:

(1) The present invention uses the MOCVD system to immediately grow the SiNx protective layer in-situ after the barrier layer has been grown, whereby the sample is neither taken out of the MOCVD reaction chamber during the epitaxial process nor exposed to the air, wherefore the present invention can prevent the heterostructure from oxidization and damage;

(2) The present invention uses the MOCVD system to in-situ grow the SiNx protective layer at a higher growth temperature and a lower growth rate, which favor realizing a high-quality SiNx protective layer and decreasing the defects in the epitaxial interface; and (3) The present invention fabricates an InAlGaN/GaN heterostructure suitable to fabricate HEMT elements and grows a high-quality in-situ SiNx protective layer to function as the protective layer of the element and the gate dielectric layer, whereby the leakage current of the gate is obviously decreased and the performance of the element is significantly enhanced.

Hereinbefore are only described the problems the present invention intends to solve, the technical measures to solve the problems, and the efficacies of the present invention. The details of the present invention will be demonstrated with embodiments and drawings below.

DETAILED DESCRIPTION OF THE INVENTION

Figure 1:
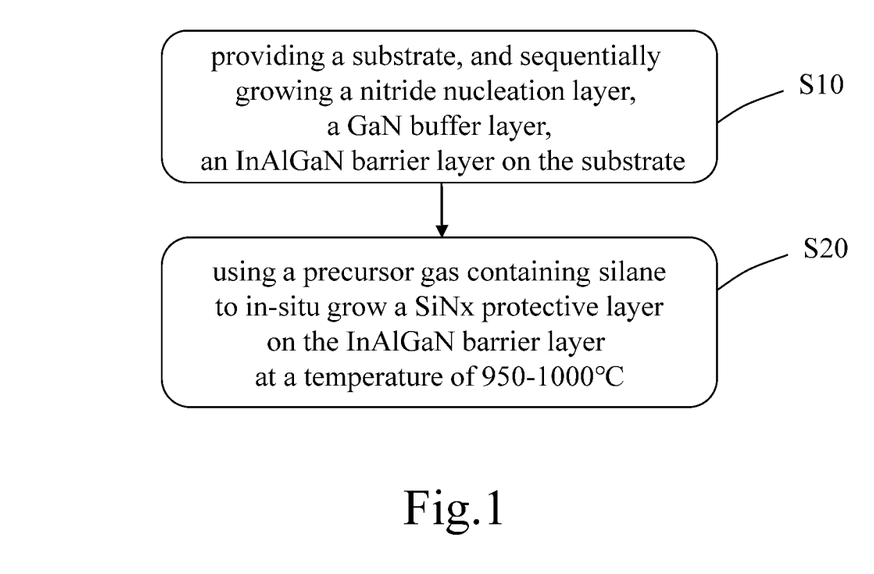
FIG. 1 shows a flowchart of a MOCVD method for growing an InAlGaN/GaN heterostructure according to one embodiment of the present invention.

Refer to FIG. 1, which shows a flowchart of a MOCVD method for growing an InAlGaN/GaN heterostructure according to one embodiment of the present invention. Simultaneously refer to FIG. 2A and FIG. 2B, which schematically show sectional views corresponding to the steps of a MOCVD method for growing an InAlGaN/GaN heterostructure according to one embodiment of the present invention. The method for growing an InAlGaN/GaN heterostructure of the present invention is realized by a MOCVD system and comprises Step S10 and Step S20.

Figure 2A:
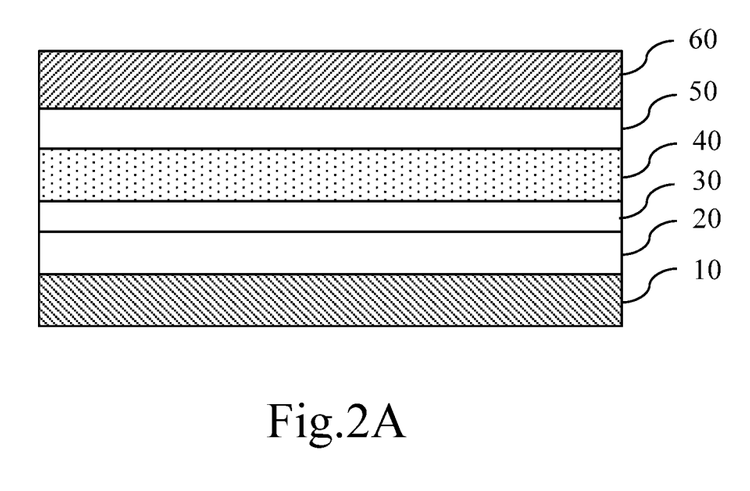
FIG. 2A and FIG. 2B schematically show sectional views corresponding to the steps of a MOCVD method for growing an InAlGaN/GaN heterostructure according to one embodiment of the present invention.

Firstly, in Step S10, provide a substrate 10, and grow a nitride nucleation layer 20, a GaN buffer layer 40, and an InAlGaN barrier layer 60 on the substrate 20 in sequence, as shown in FIG. 2A. In this embodiment, the substrate 10 may be a sapphire substrate, a silicon carbide (SiC) substrate, or a silicon substrate; the nitride nucleation layer 20 may be made of aluminum nitride (AlN). In this embodiment, Step S10 includes growing a transitional layer 30 between the nitride nucleation layer 20 and the GaN buffer layer 40 and growing a barrier intermediate layer 50 between the GaN buffer layer 40 and the InAlGaN barrier layer 60; the barrier intermediate layer 50 may be made of AlN.

Besides, in this embodiment, trimethyl indium (TMIn), trimethyl aluminum (TMAl), trimethyl gallium (TMGa), and ammonia gas ($NH_3$) are used as the precursor materials to grow the InAlGaN barrier layer 60. The InAlGaN barrier layer 60 has a thickness of 3-5 nm. It is expected: the HEMT element using the InAlGaN/GaN heterostructure fabricated according to the present invention will have a stronger spontaneous polarization effect and may induce a high-density two-dimensional electron gas (2DEG). The above-mentioned superior characteristics may lower on-resistance and decrease power loss. Therefore, the abovementioned HEMT element is very suitable to be used in power-switching elements. Besides, iron ions or carbon ions may be doped into the GaN buffer layer 40 to increase the breakdown voltage of the element.

Figure 2B:
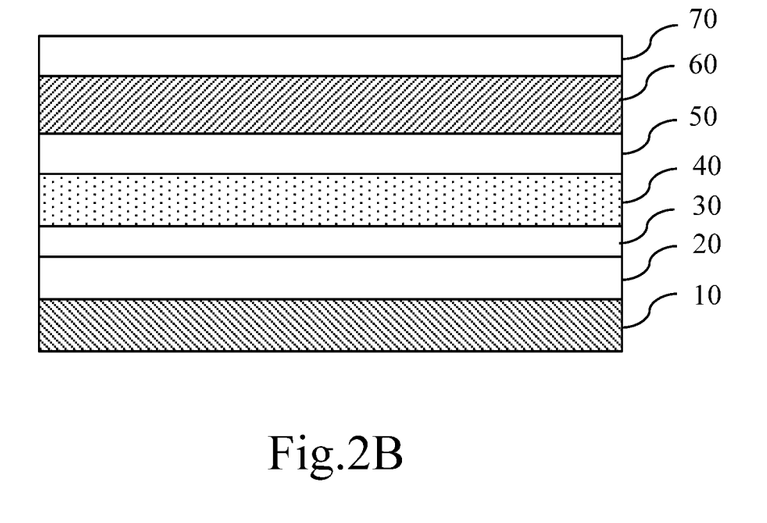

Next, in Step S20, fill a precursor gas into the reaction chamber for surface treatment. Step S20 is performed for 2-5 seconds at a temperature of 950-1000° C., a gas flow rate of 5-8 sccm and a chamber pressure of less than 50 Torr to in-situ grow a SiNx protective layer 70 on the InAlGaN barrier layer 60, whereby is achieved the InAlGaN/GaN heterostructure of the present invention, as shown in FIG. 2B. The InAlGaN/GaN heterostructure of the present invention is also called the in-situ SiNx/InAlGaN/GaN heterostructure in the specification. The precursor gas used by the present invention may contain silane ($SiH_4$), disilane ($Si_2H_6$), trisilane ($Si_3H_8$), tetrasilane ($Si_4H_{10}$), tetraethoxysilane (TEOS), or a combination thereof. In this embodiment, the precursor gas contains disilane ($Si_2H_6$).

In both Step S10 and Step S20 of the present invention, the MOCVD process is undertaken in the same reaction chamber. During the epitaxial process, the sample needn't be taken out of the reaction chamber. Therefore, the sample would not be exposed to the air. Then, the present invention can prevent the surface of the InAlGaN/GaN heterostructure from oxidation and damage. Further, the present invention uses a MOCVD system to in-situ grow the SiNx protective layer at a higher temperature and a lower growth rate, whereby to achieve a high-quality SiNx protective layer and decrease the defects of the epitaxial interface.

The details are further stated below. During the process of using a MOCVD system to in-situ grow the SiNx protective layer, the SiNx protective layer is grown at a higher temperature, and the InAlGaN barrier layer thereunder, which is grown at a relative lower temperature, become unstable. Thus, the in-situ SiNx/InAlGaN/GaN heterostructure fabricated by the present invention has an ultrathin barrier layer. Because of optimizing the fabrication process of the SiNx protective layer, the present invention not only can obtain a high-quality SiNx protective layer but also can prevent the InAlGaN barrier layer from deterioration.

Figure 3:
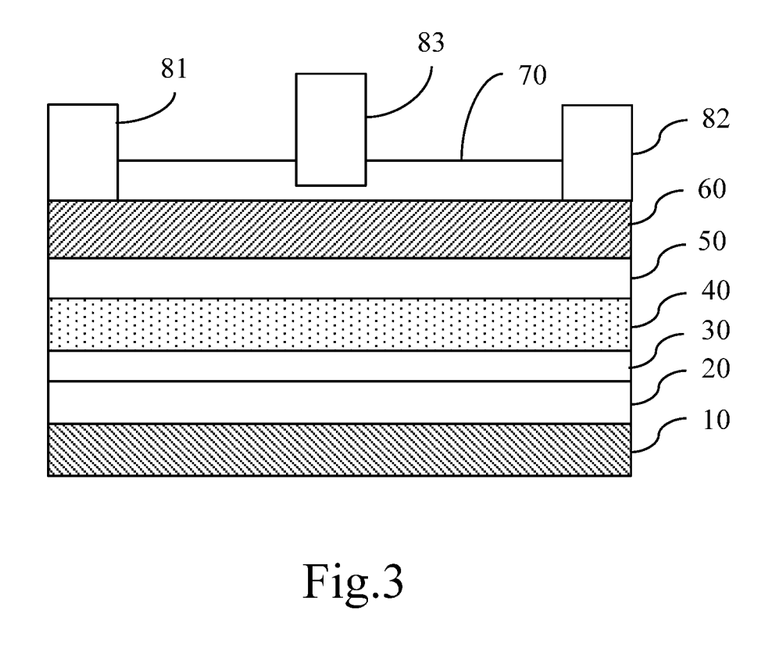
FIG. 3 shows a sectional view of an HEMT element containing an in-situ grown SiNx/InAlGaN/GaN heterostructure fabricated according to one embodiment of the present invention.

The SiNx/InAlGaN/GaN heterostructure fabricated by the present invention is suitable to produce HEMT elements, and the in-situ grown SiNx protective layer thereof is used as the surface protective layer and gate dielectric layer of the element. Refer to FIG. 3, which shows a sectional view of an HEMT element containing an in-situ SiNx/InAlGaN/GaN heterostructure fabricated according to one embodiment of the present invention. The HEMT element contains the in-situ SiNx/InAlGaN/GaN heterostructure fabricated according to the abovementioned embodiment of the present invention. In other words, the HEMT element includes the nitride nucleation layer 20, the transitional layer 30, the GaN buffer layer 40 and a barrier intermediate layer 50, the InAlGaN barrier layer 60, and the SiNx protective layer 70 in-situ grown on the InAlGaN barrier layer 60. The HEMT element further includes a source 81, a drain 82, and a gate 83 disposed between the source 81 and the drain 82, wherein the SiNx protective layer 70 functions as the surface protective layer and the gate dielectric layer. The HEMT described above is only to exemplify the present invention. However, the present invention is not limited by the exemplification.

Below is explained how the MOCVD growth temperature influences the material and electric performance of the SiNx protective layer, whereby to obtain the InAlGaN/GaN heterostructure having a high-quality SiNx protective layer. Then, the product fabricated by the method of the present invention may be applied to HEMT elements for enhancing the performance thereof. In the experimental process described below, $Si_2H_6$ and $NH_3$ are filled into the reaction chamber for surface treatment.

Figure 4:
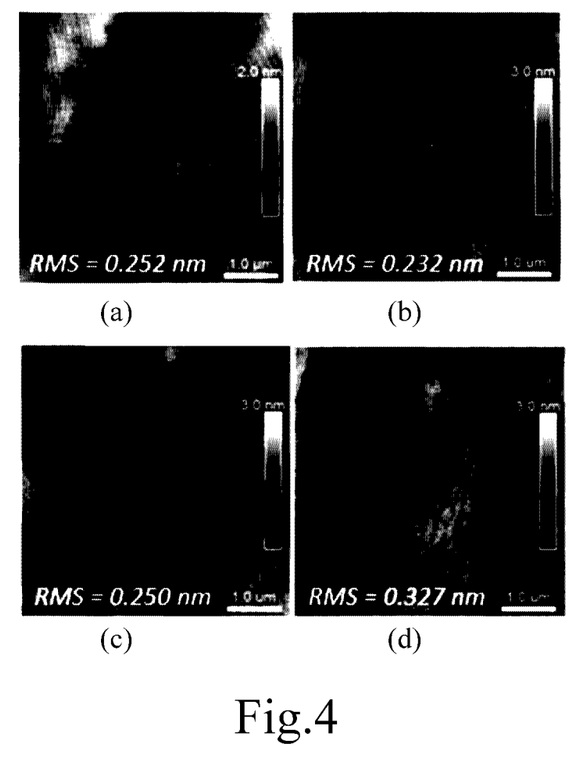
FIG. 4 shows the surface micro-topographies of the InAlGaN/GaN heterostructures (taken by the atomic force microscope AFM D3100), wherein the image (a) is free of the SiNx protective layer; the images (b), (c) and (d) respectively have the SiNx protective layers grown in-situ at temperatures of 800° ° C., 1000° C. and 1180° C.

Refer to FIG. 4, which shows the surface micro-topographies of the InAlGaN/GaN heterostructures (taken by the atomic force microscope AFM D3100), wherein the image (a) is free of the SiNx protective layer; the images (b), (c) and (d) respectively have the SiNx protective layers grown in-situ at temperatures of 800° C., 1000° C. and 1180° C. It is observed in the images: while the SiNx protective layer is grown on the InAlGaN barrier layer at an appropriate temperature, the surface thereof keeps flattened (as shown in the image (c) of FIG. 4); while the SiNx protective layer is grown at too high a temperature, the surface thereof becomes rugged (as shown in the image (d) of FIG. 4).

Figure 5:
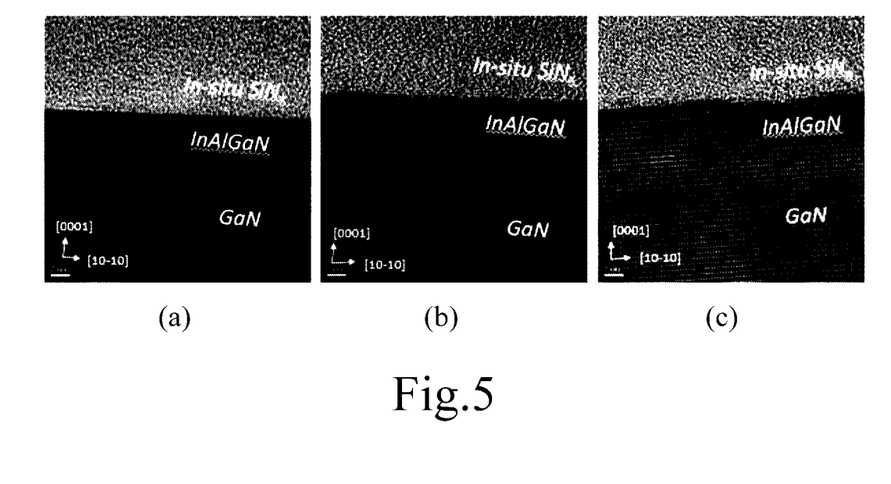
FIG. 5 shows the surface micro-topographies of the interfaces of the in-situ grown SiNx protective layers and the InAlGaN barrier layers (taken by a transmission electron microscope (TEM)), wherein the images (a), (b) and (c) respectively have the SiNx protective layers grown at temperatures of 800° C., 1000° ° C. and 1180° C.

Refer to FIG. 5, which shows the surface micro-topographies of the interfaces of the in-situ grown SiNx protective layers and the InAlGaN barrier layers (taken by a transmission electron microscope (TEM)), wherein the images (a), (b) and (c) respectively have the SiNx protective layers grown at temperatures of 800° ° C., 1000° C. and 1180° C. It is observed in the images: while the SiNx protective layer is grown at too high a temperature, the interface of the SiNx protective layer and the InAlGaN barrier layer becomes rugged (as shown in the image (c) of FIG. 5). The above-mentioned experimental results shows that high temperature results in two phenomena: the etching effect of $Si_2H_6$ becomes stronger; and the desorption rate of indium increases. Thus, the InAlGaN barrier layer thereunder is damaged.

Figure 6:
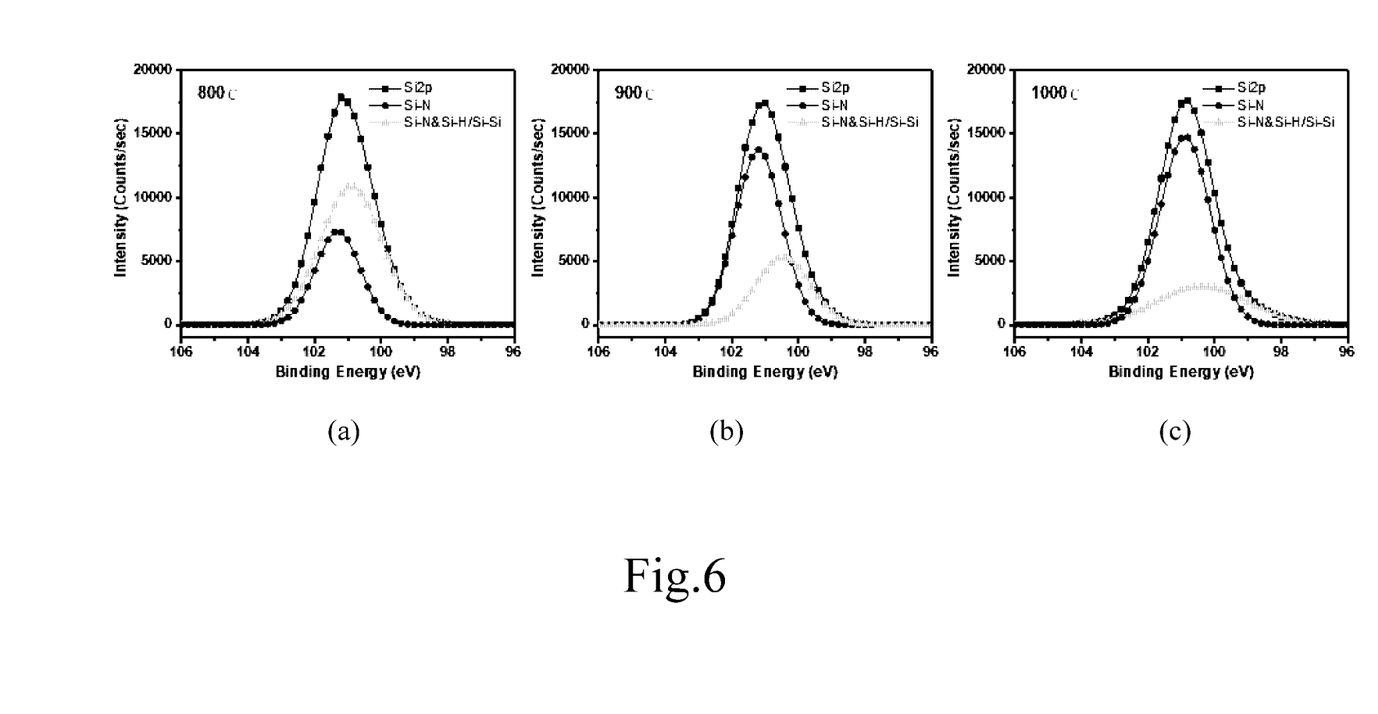
FIG. 6 shows the XPS spectra of the inner cores of the SiNx protective layers respectively in-situ grown at different temperatures, wherein the images (a), (b) and (c) show the XPS spectra of the inner cores of the SiNx protective layers respectively grown at temperatures of 800° C., 900° C. and 1000° C.

Refer to FIG. 6, which shows the XPS spectra of the inner cores of the SiNx protective layers respectively in-situ grown at different temperatures, wherein the images (a), (b) and (c) show the XPS spectra of the inner cores of the SiNx protective layers respectively grown at temperatures of 800° C., 900° ° C. and 1000° C. The experiment uses an X-ray photoelectron spectroscopy (XPS) to analyze the bonding statuses of Si2p. It is indicated by the experimental results: while the SiNx protective layer is grown at too low a temperature, the magnitude of the mixture of Si—N bonds and Si—H bonds or the magnitude of the mixture of Si—N bonds and Si—Si bonds is higher, and the magnitude of the Si—N bonds is lower. It is because the cracking efficiencies of $Si_2H_6$ and $NH_3$ are lower at a lower temperature. Thus, more Si dangling bonds are formed, and a higher interface trap density is generated.

Through optimizing the MOCVD process of the SiNx protective layer, the present invention can achieve a higher-quality SiNx protective layer and a lower interface trap density. It is shown by both the AFM and TEM examinations: in the SiNx protective layer grown at an appropriate temperature, the epitaxial surface keeps flattened and has low roughness; the interface of the SiNx protective layer and the InAlGaN barrier layer is very smooth. Further, the magnitude of the Si—N bonds increases; the magnitude of the mixture of Si—N bonds and Si—H bonds or the magnitude of the mixture of Si—N bonds and Si—Si bonds decreases. It is because $Si_2H_6$ and $NH_3$ have higher cracking rates at higher temperatures. Thus, the Si dangling bonds decreases, and the trap density of the interface and the SiNx protective layer lowers.

The present invention uses the Hall measurement to analyze the performance of 2DEG while the InAlGaN/GaN heterostructure is applied to HEMT elements. It is observed in Table.1: the in-situ SiNx protective layer enhances the performance of 2DEG of the InAlGaN/GaN heterostructure-based HEMT elements.

TABLE 1

|  | InAlGaN/GaN HEMT (free of the SiNx protective layer) | In-situ $SiN_x$/InAlGaN/GaN HEMT (the present invention) |
| --- | --- | --- |
| Carrier density (cm$^{-2}$) | $1.0 \times 10^{13}$ | $1.5 \times 10^{13}$ |
| Mobility (cm$^2$/V · s) | 1830 | 1700 |
| Sheet resistance (Ω/sq) | 330 | 240 |

Figure 7:
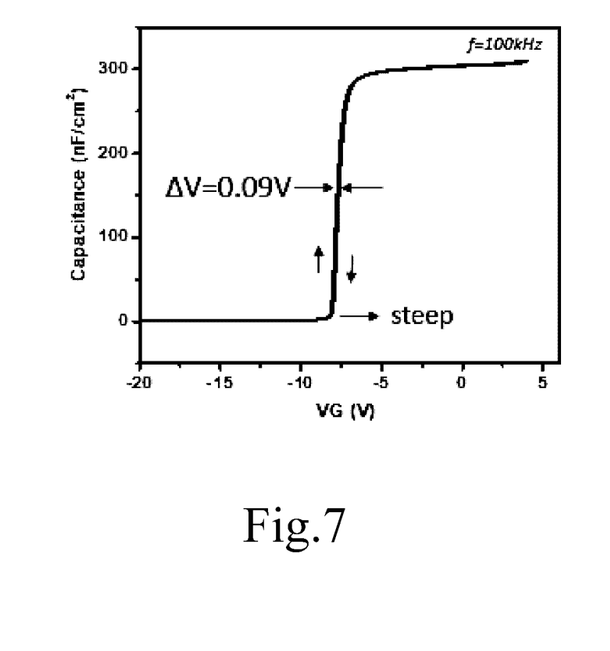
FIG. 7 shows a C-V curve obtained in a double-sweep scan of the SiNx protective layer in-situ grown at a frequency of 100 kHz, wherein the scan is performed at a frequency of 100 KHz.
Figure 8A:
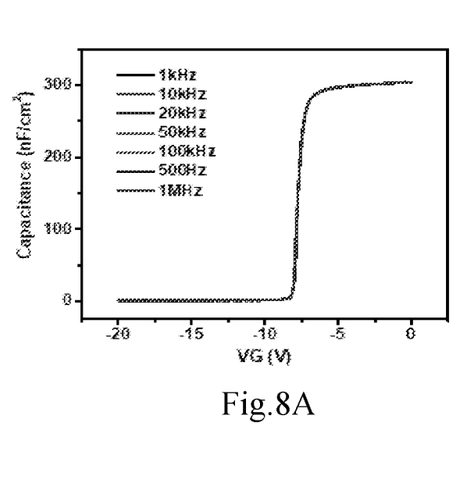
FIG. 8A shows C-V curves obtained in double-sweep scans of the in-situ grown SiNx protective layer wherein the scans are performed at frequencies ranging from 1 kHz to 1 MHz.
Figure 8B:
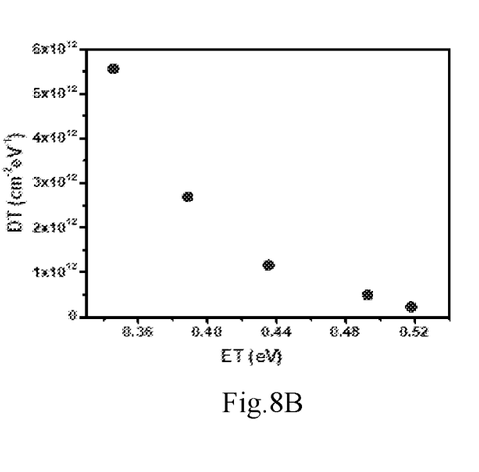
FIG. 8B shows the function of the trap density to the energy level of the conduction band of the in-situ grown SiNx/InAlGaN/GaN MIS diode.
Figure 9A:
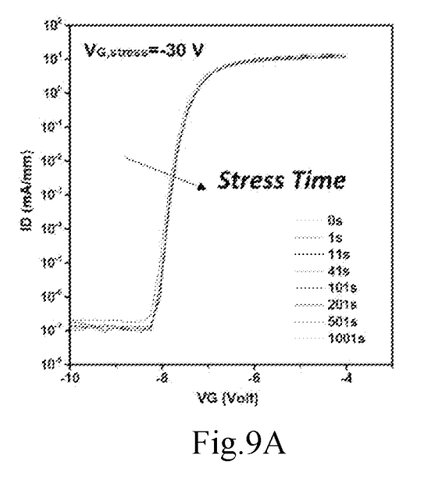
FIG. 9A and FIG. 9B show the ID-VG relationships while the gate biases of −30V and +6V are respectively applied to the in-situ grown SiNx/InAlGaN/GaN MIS HEMTs for a stress time of 1001 seconds.
Figure 9B:
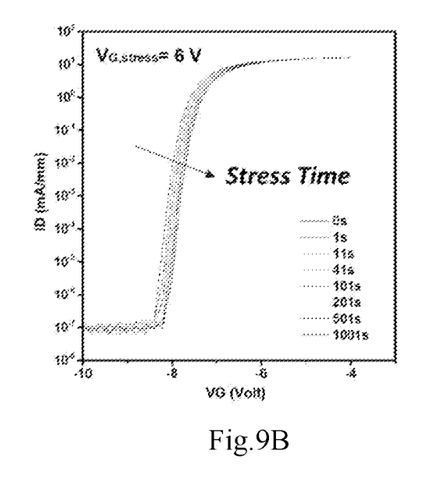
Figure 9C:
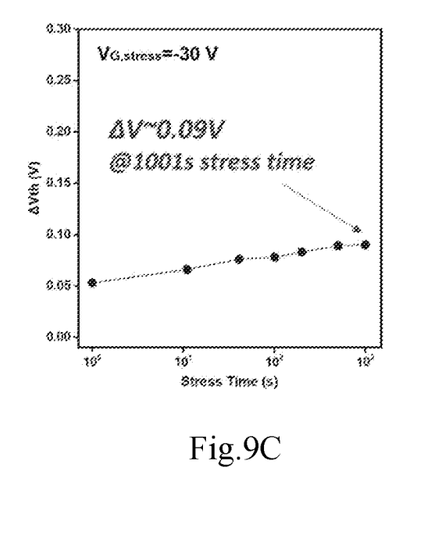
FIG. 9C and FIG. 9D show the relationships of the shifts of the threshold voltage (Vth) and the stress time ranging from 0 seconds and 1001 seconds while the gate biases of −30V and +6V are respectively applied to the in-situ grown SiNx/InAlGaN/GaN MIS HEMTs.
Figure 9D:
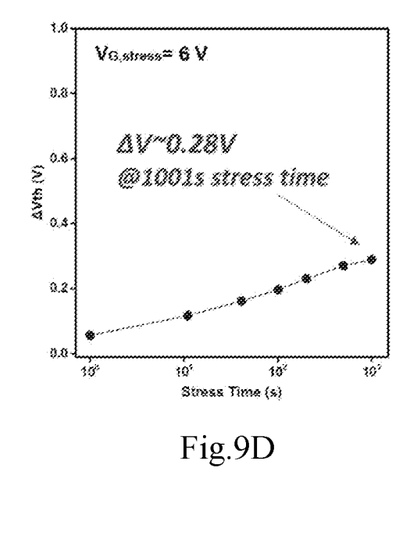

Next, the present invention uses the InAlGaN/GaN heterostructure, which is fabricated by the optimized process, to produce a simple meta-insulator-semiconductor (MIS) diode. Then, the quality of the in-situ protective layer is evaluated via measuring the grown SiNx capacitance-voltage performance and the gate stress-dependent transfer characteristics. Refer to FIG. 7. A dual-scan C-V measurement of the in-situ grown SiNx protective layer is performed at a frequency of 100 kHz and a temperature of 1000° ° C. It is observed in the measurement result: there is only a hysteresis of 0.09V in the very fast transition from charge accumulation to charge exhaust. Refer to FIG. 8A and FIG. 8B. The experiment measures the C-V performance at different frequencies ranging from 1 kH to 1 MHz and uses the Shockley-Read-Hall statistic model in computation. The results show that the in-situ grown SiNx protective layer has trap densities of $5.5 \times 10^{12}$-$2.3 \times 10^{11}$ cm$^{-2}$ eV$^{-1}$ at different energy levels of 0.34-0.51 eV of the conduction band. In comparison with the conventional common-seen gate dielectric layers, such as PECVD-SiNx, LPCVD-SiNx, and ALD $Al_2O_3$, the SiNx protective layer of the present invention, which is fabricated in a MOCVD system with an optimized process, has a lower trap density. The lower trap density indicates that the SiNx protective layer and the interface thereof have better quality.

Refer to FIGS. 9A-9D. The present invention applies biases respectively of −30V and +6V to the gate during a stress time ranging from 0 seconds to 1001 seconds and performs measurements to obtain the ID-VG relationships. It can be seen in FIG. 9A and FIG. 9B: the shifts of the threshold voltages (Vth) are smaller. It can be seen in FIG. 9C: at the bias of −30V to the gate, the shift of the threshold voltage (Vth) is very small and only 0.09V while the stress time increases from 0 seconds to 1001 seconds. It can be seen in FIG. 9C and FIG. 9D: at the bias of +6V to the gate, the shift of the threshold voltage (Vth) is 0.28V, which is smaller than the ordinary value, while the stress time increases from 0 seconds to 1001 seconds. It can been learned from the abovementioned results: in the application of the ultrathin InAlGaN/GaN barrier layer to HEMT, the present invention provides a high-quality SiNx protective layer that has a great potential to function as effective gate dielectric layers and passivation layers.

In conclusion, the present invention discloses a MOCVD method for growing an InAlGaN/GaN heterostructure, which uses an optimized MOCVD process to in-situ grow a SiNx protective layer, whereby to obtain a high-quality SiNx protective layer and a high-quality interface of the SiNx protective layer and the InAlGaN barrier layer, wherefore is achieved an InAlGaN/GaN heterostructure having an ultra-thin barrier layer. The InAlGaN/GaN heterostructure is characterized in a lower trap density, a very small CV hysteresis, and a stable threshold voltage. While applied to the high-frequency and high-power GaN transistors, especially the HEMT elements, the present invention can effectively increase output current, decrease on-resistance and gate leakage current, reduce power consumption, and apply to digital logic circuits. The products of the present invention are expected to be used in microwave communication, power amplification, and vehicular electronics with significant technical competitiveness.

The embodiments are only to exemplify the present invention but not to limit the scope of the present invention. Any equivalent modification or variation made according to the spirit or characteristics of the present invention is to be included by the scope of the present invention.

What is claimed is:

1. A method for fabricating an indium aluminum gallium nitride (InAlGaN)/gallium nitride (GaN) heterostructure, which is realized by a metal-organic chemical vapor deposition (MOCVD) process and comprises Step (1): providing a substrate, and sequentially growing a nitride nucleation layer, a GaN buffer layer, an InAlGaN barrier layer on the substrate; and Step (2): using a precursor gas containing silane to in-situ grow a SiNx protective layer on the InAlGaN barrier layer at a temperature of 950-1000° C., wherein Step (1) and Step (2) are undertaken in an identical reaction chamber.

2. The method for fabricating an InAlGaN/GaN heterostructure according to claim 1, wherein the precursor gas contains silane ($SiH_4$), disilane ($Si_2H_6$), trisilane ($Si_3H_8$), tetrasilane ($Si_4H_{10}$), tetraethoxysilane (TEOS), or a combination thereof.

3. The method for fabricating an InAlGaN/GaN heterostructure according to claim 1, wherein Step (2) is performed for 2-5 seconds at a gas flow rate of 5-8 sccm and a chamber pressure of less than 50 Torr.

4. The method for fabricating an InAlGaN/GaN heterostructure according to claim 1, wherein the nitride nucleation layer is an aluminum nitride (AlN) layer.

5. The method for fabricating an InAlGaN/GaN heterostructure according to claim 1, wherein Step (1) further includes providing a transitional layer, and wherein the transitional layer is grown between the nitride nucleation layer and the GaN buffer layer.

6. The method for fabricating an InAlGaN/GaN heterostructure according to claim 1, wherein Step (1) further include providing a barrier intermediate layer, and wherein the barrier intermediate layer is grown between the GaN buffer layer and the InAlGaN barrier layer.

7. The method for fabricating an InAlGaN/GaN heterostructure according to claim 6, wherein the barrier intermediate layer is an aluminum nitride (AlN) layer.

8. The method for fabricating an InAlGaN/GaN heterostructure according to claim 1, wherein Step (1) uses trimethyl indium (TMIn), trimethyl aluminum (TMAl), trimethyl gallium (TMGa), and ammonia gas ($NH_3$) as precursor materials to grow the InAlGaN barrier layer.

9. The method for fabricating an InAlGaN/GaN heterostructure according to claim 1, wherein the InAlGaN barrier layer has a thickness of 3-5 nm.

* * * * *